United States Patent
Chan et al.

(10) Patent No.: US 7,482,216 B2
(45) Date of Patent: Jan. 27, 2009

(54) SUBSTRATE ENGINEERING FOR OPTIMUM CMOS DEVICE PERFORMANCE

(75) Inventors: Victor W. C. Chan, Poughkeepsie, NY (US); Meikei Ieong, Wappingers Falls, NY (US); Min Yang, Mahopee, NY (US)

(73) Assignee: International Business Machines Corporation, Armonk, NY (US)

( * ) Notice: Subject to any disclaimer, the term of this patent is extended or adjusted under 35 U.S.C. 154(b) by 213 days.

(21) Appl. No.: 11/474,774

(22) Filed: Jun. 26, 2006

(65) Prior Publication Data

US 2006/0240611 A1    Oct. 26, 2006

Related U.S. Application Data

(62) Division of application No. 10/604,003, filed on Jun. 20, 2003, now Pat. No. 7,148,559.

(51) Int. Cl.
*H01L 21/8238*   (2006.01)
(52) U.S. Cl. ............... 438/199; 438/455; 257/E21.633
(58) Field of Classification Search ........... 438/198, 438/199, 455, 257, 372, 149, 154, 157, 164; 257/627, 628, 367–369, E21.633, 351, 338, 257/E21.122, E29.004, E27.064
See application file for complete search history.

(56) References Cited

U.S. PATENT DOCUMENTS

| | | | |
|---|---|---|---|
| 5,171,703 A * | 12/1992 | Lin et al. ............. | 438/198 |
| 5,317,175 A * | 5/1994 | Throngnumchai ...... | 257/255 |
| 6,245,615 B1 | 6/2001 | Noble et al. | |
| 6,368,903 B1 | 4/2002 | Bryant et al. | |
| 6,483,171 B1 | 11/2002 | Forbes et al. | |
| 2001/0026006 A1 | 10/2001 | Noble et al. | |
| 2002/0014666 A1 | 2/2002 | Ohmi et al. | |
| 2002/0063292 A1* | 5/2002 | Armstrong et al. ...... | 257/367 |
| 2002/0173093 A1 | 11/2002 | Juengling | |
| 2002/0185676 A1 | 12/2002 | Momose et al. | |
| 2004/0161886 A1* | 8/2004 | Forbes et al. ........... | 438/198 |
| 2008/0036005 A1* | 2/2008 | Armstrong et al. ...... | 257/367 |

FOREIGN PATENT DOCUMENTS

GB    51453/68    10/1968
JP    62-92361    4/1987

(Continued)

*Primary Examiner*—Thomas L Dickey
*Assistant Examiner*—Fazli Erdem
(74) *Attorney, Agent, or Firm*—Scully, Scott, Murphy & Presser, P.C.; Joseph P. Abate, Esq.

(57) ABSTRACT

An integrated semiconductor structure having different types of complementary metal oxide semiconductor devices (CMOS), i.e., PFETs and NFETs, located atop a semiconductor substrate, wherein each CMOS device is fabricated such that the current flow for each device is optimal is provided. Specifically, the structure includes a semiconductor substrate that has a (110) surface orientation and a notch pointing in a <001> direction of current flow; and at least one PFET and at least one NFET located on the semiconductor substrate. The at least one PFET has a current flow in a <110> direction and the at least one NFET has a current flow in a <100> direction. The <110> direction is perpendicular to the <100> direction. A method of fabricating such as integrated semiconductor structure is also provided.

10 Claims, 5 Drawing Sheets

FOREIGN PATENT DOCUMENTS

| | | |
|---|---|---|
| JP | 01076755 | 9/1987 |
| JP | 64-7675 | 3/1989 |
| JP | 64-70748 | 3/1989 |
| JP | 01076755 | 3/1989 |
| JP | 2181948 | 7/1990 |
| JP | 7-183488 | 7/1995 |
| JP | 411354394 | 12/1999 |

* cited by examiner

SUBSTRATE ENGINEERING FOR OPTIMUM CMOS DEVICE PERFORMANCE

RELATED APPLICATIONS

This application is a divisional of U.S. application Ser. No. 10/604,003, filed Jun. 20, 2003 now U.S. Pat. No. 7,148,559.

FIELD OF THE INVENTION

The present invention relates to integrated semiconductor structures, and more particularly to an integrated semiconductor structure having different types of complementary metal oxide semiconductor devices (CMOS), i.e., PFETs and NFETs, located atop a semiconductor substrate, wherein each CMOS device is fabricated such that the current flow for each device is optimal. The present invention also relates to a method of forming such an integrated semiconductor structure.

BACKGROUND OF THE INVENTION

In the semiconductor industry, it has become more and more difficult in recent years to improve device performance. Mobility enhancement is a known way to improve complementary metal oxide semiconductor (CMOS) device performance. For example, it is known that the electron and hole mobility are affected by the wafer surface orientations as well as the current flow directions. This is because of the anisotropic effective mass behaviors of the inversion layer carriers.

Figure 1A:
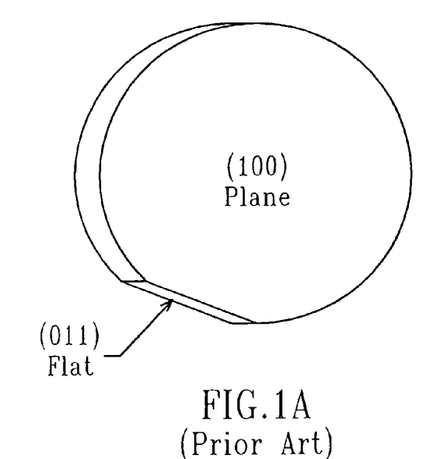
FIGS. 1A-1B are pictorial representations of a standard prior art semiconductor wafer that is based on a (100) surface orientation with a notch located at a <011> direction.
Figure 2A:
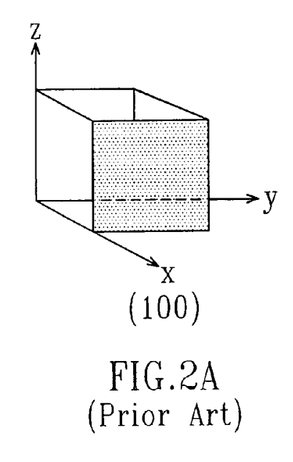
FIGS. 2A-2C are pictorial representations illustrating that the surface orientation is defined as the surface normal vector out of the crystal plane of the semiconductor wafer.
Figure 2B:
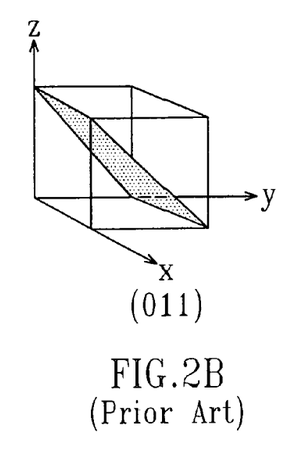
Figure 2C:
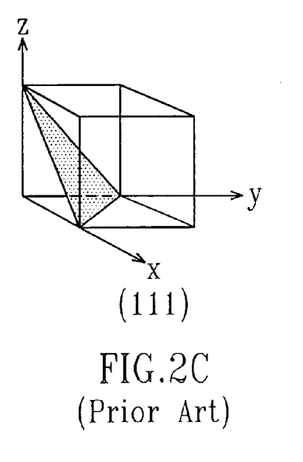

Currently, CMOS devices are formed on a semiconductor wafer that is based on a (100) surface orientation, i.e., crystal plane, with a notch or wafer flat located at the <011> direction. Such a wafer is shown, for example, in FIG. 1A. The surface orientation is defined as the surface normal vector out of the crystal plane of the semiconductor wafer. The standard notation for crystal planes is illustrated in FIGS. 2A, 2B and 2C. The current direction of a MOSFET can be designed at device layout. Under normal operation, the MOSFET current always flows from the source to the drain side modulated by the gate terminal. Therefore, the current flow direction can be controlled by rotating the PC (i.e., polysilicon mask) and RX (i.e., active silicon) masks with respect to the wafer notch.

Figure 1B:
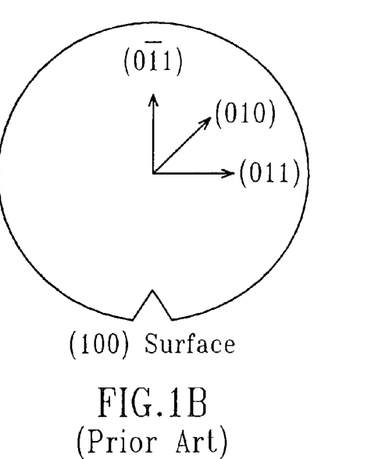

FIG. 1B is another pictorial representation of a semiconductor wafer having a (100) surface orientation with a notch located at the <011> direction. For a (100) oriented semiconductor wafer, the current flow is insensitive to the current flow directions, if polySi gates are laid out either parallel or perpendicular to the wafer notch.

It is also known in the semiconductor industry that the substantial enhancement of hole mobility (2.7x) can be achieved by using a (110) surface-oriented semiconductor wafer. The enhancement factor is directional dependent. For example, there is more enhancement for the <110> direction than that of the <100> direction. However, electron mobility is known to be degraded in a (110) surface oriented wafer by a comparable percentage. This electron mobility degradation on a (110) wafer is also directional dependent. For example, there is less degradation from the <100> direction than that of the <110> direction.

In view of the state of the art mentioned above, there is a need for providing semiconductor substrate engineering for obtaining CMOS devices having optimum performance.

SUMMARY OF THE INVENTION

One object of the present invention is to provide an integrated semiconductor structure that includes a semiconductor substrate having a surface orientation that allows for the subsequent fabrication of CMOS devices of high performance.

Another object of the present invention is to provide an integrated semiconductor structure in which the semiconductor substrate is engineered to have a surface orientation that provides substantial current enhancement for PFET devices with relatively small current degradation for NFET devices.

A further object of the present invention is to provide an integrated semiconductor structure including an engineered semiconductor substrate having a surface orientation that permits high current flow for PFETs as well as NFETs.

A yet further object of the present invention is to provide an integrated semiconductor structure having an engineered semiconductor substrate that is sensitive to current flow directions.

An even further object of the present invention is to provide an integrated semiconductor structure having an engineered semiconductor substrate with NFETs and PFETs positioned on the substrate such that both devices have high performance.

A still other object of the present invention is to provide an integrated semiconductor structure including an engineered semiconductor substrate with NFETs and PFETs positioned on the substrate such that both devices have high performance wherein the integrated semiconductor structure is fabricated using relatively simple, and inexpensive processing steps.

These and other objects and advantages are achieved in the present invention by providing a semiconductor substrate having a specific surface orientation which can be used in fabricating CMOS devices thereon that have optimal current flow and thus optimal performance. In particular, the applicants of the present application have determined through experimentation that by using a semiconductor substrate having a (110) surface orientation and a notch pointing in a <001> direction of current flow, optimal CMOS devices can be formed on such a substrate since the substrate is sensitive to current flow directions.

The present invention thus has advantages over other mobility enhancement techniques known in the art. For example, mobility enhancement caused by forming strained Si on a relaxed SiGe layer will affect dopant diffusion, defect density, and self-heating. The CMOS devices fabricated with the method of the present invention provide a net gain in mobility without affecting many of the other device characteristics. The additional cost to implement this feature is insignificant.

In broad terms, the method of the present invention comprises the steps of:

providing a semiconductor substrate that has a (110) surface orientation and a notch pointing in a <001> direction of current flow; and fabricating at least one PFET and at least one NFET on the semiconductor substrate, wherein said at least one PFET has a current flow in a <110> direction and the at least one NFET has a current flow in a <100> direction, said <110> direction is perpendicular to the <100> direction.

In addition to providing a method of fabricating an integrated semiconductor structure, the present invention is also related to the integrated semiconductor structure that is fabricated by the method of the present invention. Specifically, and in broad terms, the integrated semiconductor structure of the present invention comprises:

a semiconductor substrate having a (110) surface orientation and a notch pointing in a <001> direction of current flow; and at least one PFET and at least one NFET located on the semiconductor substrate, wherein said at least one PFET has a current flow in a <110> direction and the at least one NFET has a current flow in a <100> direction, said <110> direction is perpendicular to the <100> direction.

DETAILED DESCRIPTION OF THE INVENTION

The present invention, which provides substrate engineering for optimum CMOS device performance, will now be described in greater detail by referring to the drawings that accompany the present application. In the accompanying drawings, like reference numerals are used for describing like and corresponding elements.

As stated in the background section of the present application, the prior art typically forms its' semiconductor devices on a semiconductor substrate having a (100) surface orientation and a notch pointing at the <011> direction of current flow; See, for example, FIGS. 1A-1B. Applicants have determined through surface engineering that the prior art semiconductor substrate having a (100) surface orientation and a notch at the <011 > direction of current flow is insensitive to current flow directions if the gates of the FET are laid out either parallel or perpendicular to the wafer notch.

In an attempt to determine the optimum surface orientation and current flow for fabricating high performance semiconductor devices, the IV characteristics for PFETs and NFETs on semiconductor substrates with various surface orientations and current flow directions were determined. In particular, the applicants of the present application performed experimentation, in the terms of IV characteristics, to illustrate the enhancement (degradation) factor for PFETs and NFETs with various surface orientation and current flow. The following table summarizes the enhancement and degradation factors with respect to the current for various substrates.

|  | (100) surface <100> direction | (110) surface <110> direction | (100) surface <100> direction |
|---|---|---|---|
| NFET | 1 | 0.428 | 0.568 |
| PFET | 1 | 2.38 | 1.61 |

From this table, the applicants of the present application have determined that in order to obtain optimal CMOS device performance the initial or starting semiconductor substrate should have a (110) surface orientation, i.e., a (110) crystal plane. It is also deduced from the above that when a semiconductor substrate having a (110) surface orientation is used, the NFETs should be laid out such that the current flows in the <100> direction, while the PFETs should be laid out such that the current flows in the <110> direction. Such a layout will provide an approximate 2.4×PFET current with NFET current reduced to about 57% compared to that on a (100) wafer. Thus, by using a starting semiconductor substrate having a (110) surface orientation substantial PFET current enhancement with relatively small NFET current degradation will be obtained in the present invention.

Figure 3:
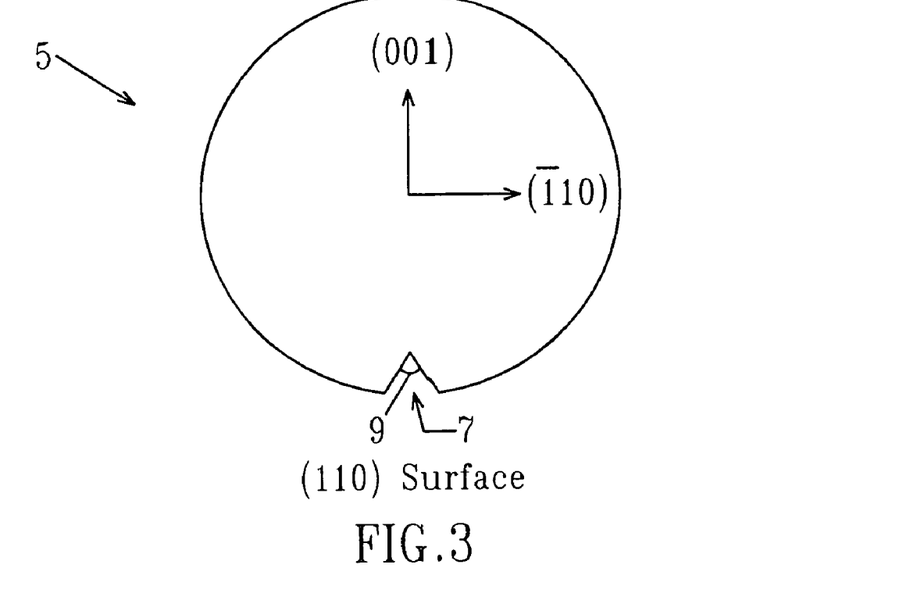
FIG. 3 is a pictorial representation of a semiconductor substrate of the present invention that is based on a (110) surface orientation with a notch located at a <001> direction.

FIG. 3 provides a pictorial representation of the initial or starting semiconductor substrate (labeled as 5) that is employed in the present invention. FIG. 3 includes the <001> direction and the <110> direction of current flow. The <100> direction of current flow is perpendicular to both the <001> and the <110>; hence the <100> direction is coming out of the plane of the drawing. The term "semiconductor substrate" is used in the present invention to denote any semiconducting material including, but not limited to: Si, SiGe, SiC, SiGeC, GaAs, InAs, InP or other like III/V compound semiconductors. A preferred semiconductor substrate is a Si substrate.

As illustrated, the initial semiconductor substrate has a notch (labeled as 7) in which the apex (labeled as 9) is pointing at the <001> direction. The notch is formed in the semiconductor substrate using standard techniques that are well known to those skilled in the art.

Figure 4:
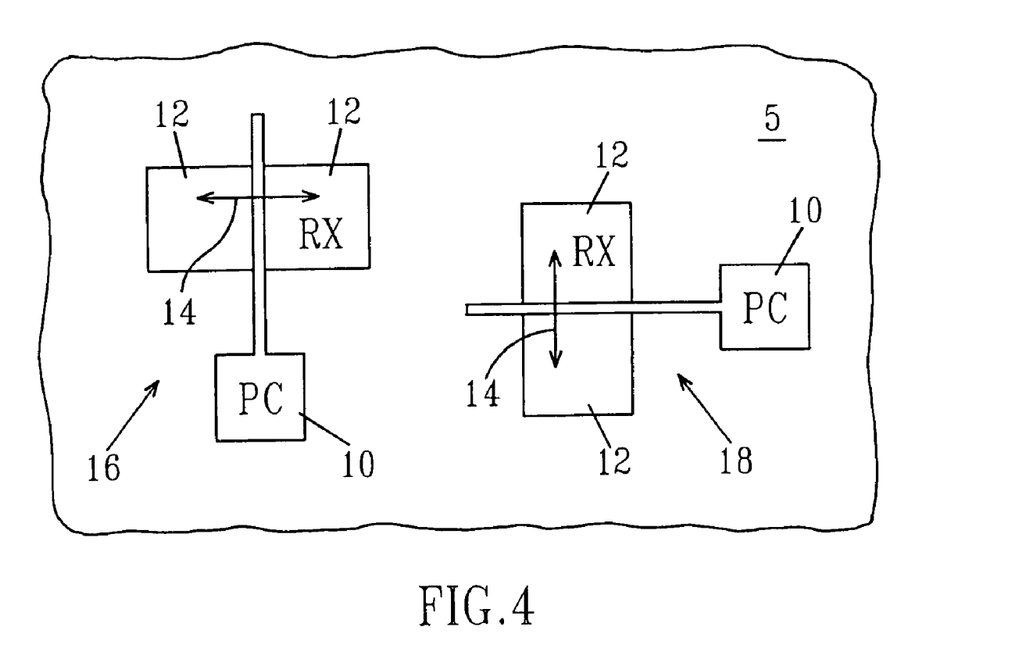
FIG. 4 is a pictorial representation (through a top-down view) showing the direction of current flow of the integrated semiconductor structure of the present invention.

After providing the semiconductor substrate having a (110) surface orientation and a notch at the <001> direction of current flow, at least one NFET and a least one PFET are formed on the semiconductor substrate in a manner such that the at least one NFET has a current flow in the <100> direction, while the at least one PFET has a current flow in the <110> direction. That is, the NFETs are formed so as to be perpendicular to the PFETs. This configuration for the at least one NFET and the at least one PFET is shown, for example, in FIG. 4. In FIG. 4, PC (labeled as element 10) denotes the gate region, while RX (labeled as 12) denotes the source/drain regions. The direction of current flow is labeled as 14.cm The NFET is labeled as 16, while the PFET is labeled as 18.

The integrated semiconductor structure of the present invention thus includes a semiconductor substrate 5 having a (110) surface orientation and a notch 7 pointing in a <001> direction of current flow (see FIG. 3); and at least one PFET 18 and at least one NFET 16 located on the semiconductor substrate 5, wherein said at least one PFET 18 has a current flow in a <110> direction and the at least one NFET 16 has a current flow in a <100> direction, said <110> direction is perpendicular to the <100> direction (see FIG. 4).

The at least one NFET and at least one PFET are formed using conventional CMOS processing steps that are well known to those skilled in the art except that the NFETs and PFETs are fabricated such that they have current flow that is perpendicular to each other. The process flow will now be described in greater detail with reference to FIGS. 5A-5F. The process flow for fabricating such NFETs and PFETs may begin with forming one or more isolation regions (not specifically shown), such as trench isolation regions or local oxidation of silicon (LOCOS) isolation regions, in the substrate.

The formation of the LOCOS oxidation region includes the use of a standard LOCOS process. The trench isolation regions are formed by first forming a sacrificial material (not shown), such as an oxide, on the surface of the semiconductor substrate. The sacrificial material may be formed by deposition or by a thermal process such as oxidation. Trench regions are then formed into the semiconductor substrate by applying a photoresist to the sacrificial material, exposing the photoresist to a pattern of radiation, developing the pattern into the exposed photoresist using a conventional resist developer, and transferring the pattern from the photoresist into the sacrificial material and then the semiconductor substrate using an etching process such as reactive-ion etching (RIE). After pattern transfer, the photoresist may or may not be removed from the structure utilizing a conventional resist stripping process. A trench liner, such as TiN, may be formed onto the exposed sidewalls of the trench by deposition or a thermal technique and then the trench is filled with a trench dielectric material such as, for example, a high density plasma oxide or tetraethylorthosilicate (TEOS). After trench fill, the structure may be planarized to the top surface of the semiconductor substrate. The isolation regions may be located between the NFETs and the PFETs.

A gate dielectric 50 (see FIG. 5A) is formed on a surface of the semiconductor substrate 5 by deposition or thermal oxidation, nitridation or oxynitridation. Combinations of the aforementioned processes may also be used in forming the gate dielectric 50. The gate dielectric 50 is comprised of an insulating material including, but not limited to: an oxide, nitride, oxynitride or any combination thereof.

Figure 5A:
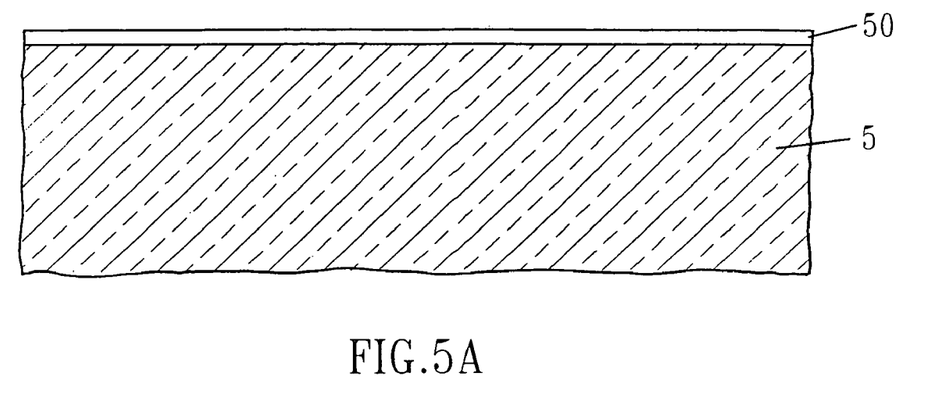
FIGS. 5A-5F are pictorial representations (through cross-sectional views) showing the basic processing steps used in the present invention.

A highly preferred insulating material that is employed in the present invention as the gate dielectric 50 is $SiO_2$. Although it is preferred to use $SiO_2$ as the gate dielectric material, the present invention also contemplates using insulating materials, i.e., dielectrics, which have a higher or lower dielectric constant, k, than $SiO_2$. For example, the gate dielectric 50 may comprise a high-k oxide such as $Al_2O_3$ or a perovskite-type oxide.

The physical thickness of the gate dielectric 50 may vary, but typically the gate dielectric 50 has a thickness of from about 0.5 to about 20 nm, with a thickness of from about 1.0 to about 10.0 nm being more highly preferred.

Figure 5B:
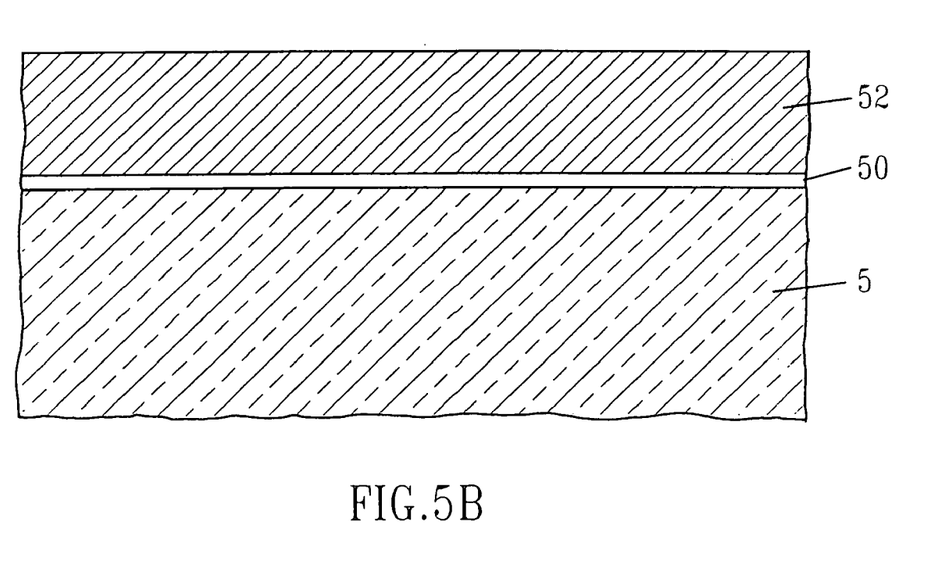

After forming the gate dielectric 50, a gate conductor 52 is formed on at least the exposed upper surface of the gate dielectric 50 (see, FIG. 5B). The gate conductor 52 is comprised of a conductive material including, but not limited to: elemental metals such as W, Pt, Pd, Ru, Re, Ir, Ta, Mo or combinations, including alloys, and multilayers thereof; silicides and nitrides of the foregoing elemental metals; polysilicon either doped or undoped; or combinations and multilayers thereof. One highly preferred conductive material employed as the gate conductor 52 is doped polysilicon.

The gate conductor 52 is formed utilizing a deposition process such as CVD, plasma-assisted CVD, sputtering, evaporation, chemical solution deposition or plating. When metal silicides are employed, a conventional silicidation process may be used in forming the same. On the other hand, when doped polysilicon is employed as the gate conductor 52, the doped polysilicon may be formed by an in-situ doping deposition process, or alternatively, a layer of undoped silicon is first deposited and thereafter an ion implantation process is employed in doping the undoped polysilicon. The doping of the undoped polysilicon may occur immediately after deposition or in a later processing step.

The physical thickness of the gate conductor 52 formed at this point of the present invention may vary depending on the conductive material employed as well as the process used in forming the same. Typically, however, the gate conductor 52 has a thickness of from about 20 to about 400 nm, with a thickness of from about 50 to about 200 nm being more highly preferred.

A hard mask, not shown, may be formed atop the gate conductor prior to patterning the gate conductor. The hard mask may be comprised of an oxide, nitride, oxynitride or any combination thereof.

Figure 5C:
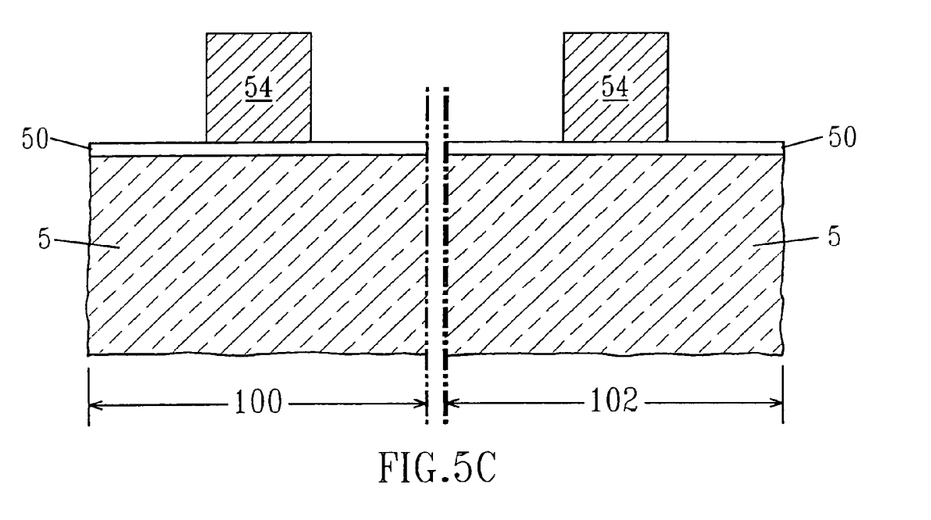
Figure 5D:
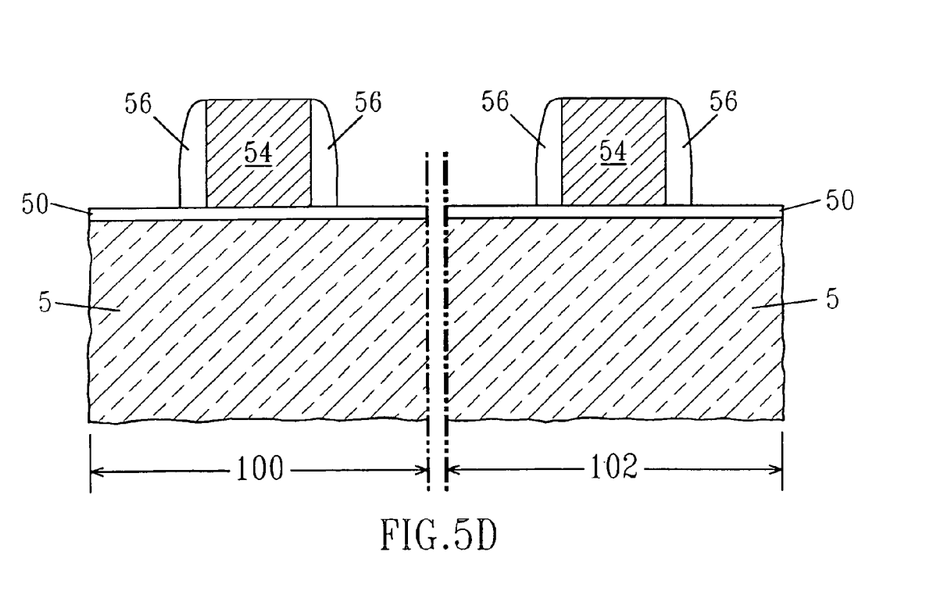

The gate conductor 52 (and optional hard mask) may be patterned at this point of the present invention utilizing lithography and an etching step to provide a plurality of patterned gate conductors 54. FIG. 5C shows the structure after the patterning step. The NFET device region is labeled as 100 and the PFET device region is labeled as 102. Although showing the presence of a single patterned gate conductor in each device region, a plurality of patterned gate conductors may be formed in each device region, as appropriate. The etching step may stop atop the gate dielectric 50 or it may remove the gate dielectric 50. In embodiments where a hard mask is employed, this etching step may also remove the hard mask from the structure. FIG. 5C shows a structure in which the etching stops atop the gate dielectric 50.

Next, source/drain extensions (not shown) may be formed into the semiconductor substrate using an ion implantation process. Spacers 56 are then formed on the sidewalls of each patterned gate conductor 54. See FIG. 5D. The spacers 56 are comprised of a conventional insulating material such as an oxide, nitride, oxynitride or any combination including multilayers thereof. Preferably, the spacers 56 are composed of SiN or $SiO_2$, with SiN spacers being especially preferred in the present invention. The spacers 56 are formed by deposition and etching. Note that the spacers 56 can be formed atop a portion of gate dielectric as shown, or they may be formed directly atop the semiconductor substrate if the gate dielectric was previously removed. In embodiments where the gate dielectric was not previously removed, the unprotected portions of the gate dielectric 50 can be removed during or after the spacer etch. Note also that the hard mask may also be removed during this step of the present invention.

Figure 5E:
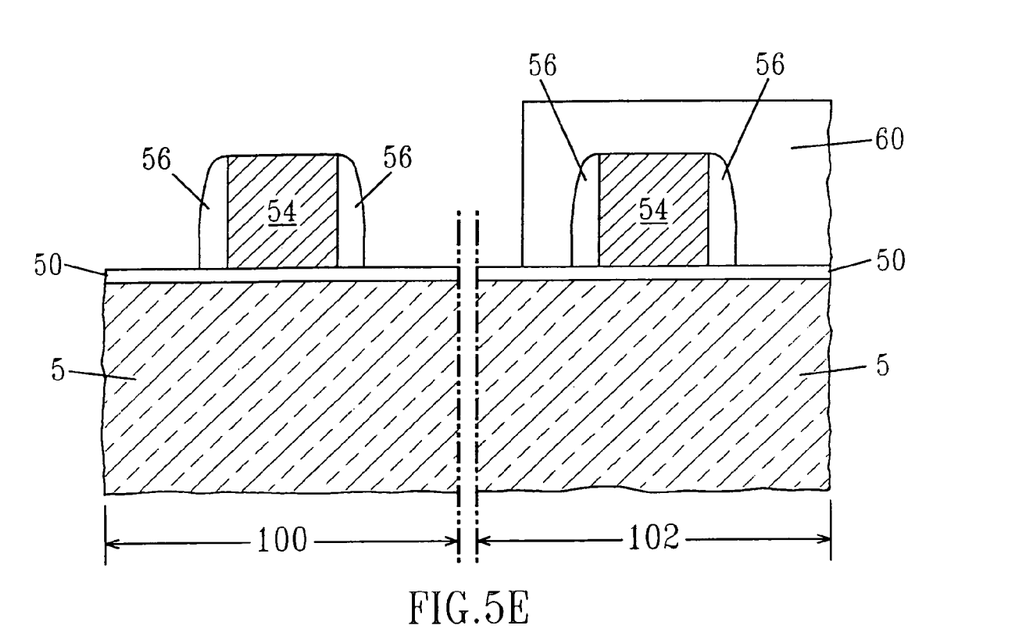
Figure 5F:
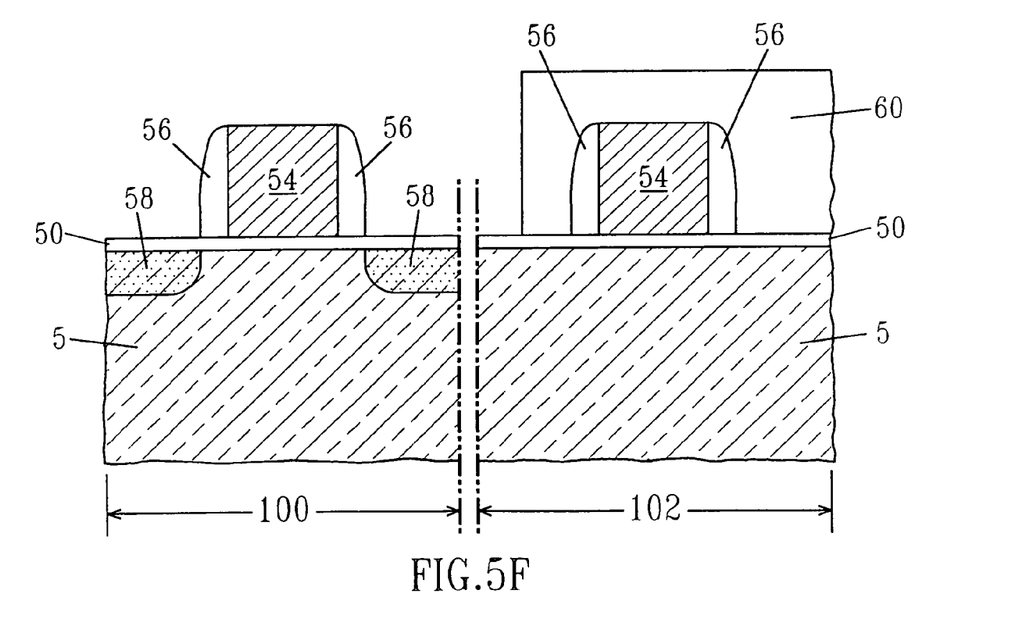

At this point of the present invention, a block mask is formed over a portion of the semiconductor substrate in which either the NFET or PFET will be formed. FIG. 5E shows the case in which block mask 60 is formed atop the PFET device region 102.

Next, source/drain regions 58 for the NFETs may be formed into the semiconductor substrate by ion implantation and annealing. The dopant for forming the NFETs is arsenic and/or phosphorus. The resultant structure including source/drain regions 58 is shown, for example, in FIG. 5F.

After forming the source/drain regions in the NFET gate region, the block mask 60 is removed from the structure using a conventional resist stripping process; another block mask is formed over the thus completed NFET region; and then the source/drain regions for PFETs are formed using boron and/or antimony, for example, as the dopant ion. In accordance with the present invention, the PFETs are formed such that the current flow is perpendicular to the current flow of the NFETs region. This can be accomplished by 1) placing the PFETs such that the direction indicated as 14 in FIG. 4 is pointing to the wafer notch, or 2) placing the NFETs such that the direction indicated as 14 of FIG. 4 is pointing to the direction perpendicular to the wafer notch.

After forming the PFETs perpendicular to the NFET the other block mask is removed providing the structure shown in FIG. 4. Note that although the above describes forming the NFETs prior to the PFETs, the process flow works when the PFETs are formed prior to the NFETs.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new is:

1. A method of forming an integrated semiconductor structure comprising:
   providing a semiconductor substrate that has a (110) surface orientation and a notch pointing in a <001> direction of current flow of at least one NFET; and
   fabricating at least one PFET having a first source and a first drain on said semiconductor substrate, wherein a first channel of said at least one PFET is parallel to a <110> direction;
   fabricating said at least one NFET having a second source and a second drain on said semiconductor substrate, wherein a second channel of said at least one NFET is parallel to said <001> direction, wherein said <110> direction is perpendicular to said <001> direction; and
   fabricating at least one first gate conductor overlying each of said at least one first channel and at least one second gate conductor overlying said at least one second channel.

2. The method of claim 1 wherein said at least one PFET and at least one NFET are formed by the steps of: forming a gate dielectric on a surface of the semiconductor substrate; forming patterned gate conductors on the gate dielectric; blocking some of the patterned gate conductors with a block mask; forming source/drain regions in the unblocked areas; removing the block mask; forming another block mask over areas containing the source and drain regions; and forming source/drain regions in the previously unblocked areas.

3. The method of claim 2 further comprising forming spacers on exposed sidewalls of each patterned gate conductor prior to said blocking step.

4. The method of claim 2 wherein said gate dielectric is formed by a thermal process or deposition.

5. The method of claim 2 wherein the patterned gate conductors are formed by deposition and etching.

6. The method of claim 1 wherein the at least one NFET comprises source/drain regions formed by ion implanting a dopant selected from the group consisting of arsenic and phosphorus into the semiconductor substrate.

7. The method of claim 1 wherein the at least one PFET comprising source/drain regions formed by ion implanting a dopant selected from the group consisting of boron and antimony into the semiconductor substrate.

8. The method of claim 1 wherein the at least one PFET and the at least one NFET each include source/drain regions, wherein the source/drain regions of the at least one PFET lie perpendicular to the source/drains of the at least one NFET.

9. The method of claim 1 wherein said fabricating comprises placing the at least one PFET such that the current flow of the at least one PFET is pointed to the notch.

10. The method of claim 1 wherein said fabricating comprises placing the at least one NFET such that the current flow of the at least one NFET is perpendicular to the notch.

* * * * *